United States Patent [19]

Dingwall

[11] 3,888,706

[45] June 10, 1975

[54] METHOD OF MAKING A COMPACT GUARD-BANDED MOS INTEGRATED CIRCUIT DEVICE USING FRAMELIKE DIFFUSION-MASKING STRUCTURE

[75] Inventor: Andrew Gordon Francis Dingwall, Somerville, N.J.

[73] Assignee: RCA Corporation, New York, N.Y.

[22] Filed: Aug. 6, 1973

[21] Appl. No.: 385,668

[52] U.S. Cl. ................ 148/187; 148/175; 148/188; 148/189

[51] Int. Cl. ............................................ H01i 7/44

[58] Field of Search.................... 148/187, 189, 175; 317/235 R, 235 G; 29/571

[56] References Cited

UNITED STATES PATENTS

| | | | |
|---|---|---|---|
| 3,475,234 | 10/1969 | Kerwin et al. | 148/187 |
| 3,576,478 | 4/1971 | Watkins | 317/235 R |
| 3,646,665 | 3/1972 | Kim | 29/571 |
| 3,673,471 | 6/1972 | Klein et al. | 317/235 R |
| 3,730,787 | 5/1973 | Murphy et al. | 148/175 |
| 3,783,047 | 1/1974 | Paffen et al. | 148/187 |

*Primary Examiner*—Walter R. Satterfield
*Attorney, Agent, or Firm*—H. Christoffersen; R. P. Williams

[57] ABSTRACT

A process of making an integrated circuit device which includes an insulated gate field effect transistor having a self-aligned gate electrode and being surrounded by a channel-stopper guard band, includes photolithographically forming on a silicon wafer a silicon-layer-containing, self-aligned diffusion mask which has the form of a frame with a crossbar so that two spaced portions of the wafer surface within the frame and a portion of the wafer surface outside the frame are exposed. Diffusion of conductivity modifiers through the wafer surface portions within the frame produces spaced source and drain regions for the insulated gate field effect transistor and diffusion of conductivity modifiers through the wafer surface outside the frame defines a guard band. The width of the crossbar defines the spacing between the source and drain regions, and the width of the sides of the frame defines the spacing between the source or drain regions and the guard band. A compact structure is achieved because all the diffused regions and the gate electrode are defined by one photomask, so that mask misalignment tolerances, which must be provided when separate photomasks are used, are avoided.

12 Claims, 12 Drawing Figures

METHOD OF MAKING A COMPACT GUARD-BANDED MOS INTEGRATED CIRCUIT DEVICE USING FRAMELIKE DIFFUSION-MASKING STRUCTURE

This invention relates to integrated circuit devices of the type which include insulated gate field effect transistors. More particularly, this invention concerns a process by which a compact, guard-banded device having self-aligned, insulated gate field effect transistors may be produced.

The self-alignment process for making an insulated gate field effect transistor is well known. One version of the process is disclosed, for example, in Kerwin et al., U.S. Pat. No. 3,475,234. This process generally involves the diffusion of the source and drain regions of an insulated gate field effect transistor using a silicon gate electrode structure as part of the diffusion mask, with simultaneous or subsequent diffusion of conductivity modifiers into the silicon gate electrode to render it conductive. The silicon gate electrode may be oxidized, or a deposited insulating coating may be provided thereover, so that interconnection conductors can cross the gate electrode.

Heretofore, self-aligned silicon gate devices have employed features such as thick field oxides and channel-stopper guard bands for the purpose of improving the performance and reliability of the devices. The locations of the critical boundaries of the various elements, such as the sources and drains, the field oxides, and the guard bands of these devices have usually been established by separated photomasking steps. Processes are known in the art in which photomasking steps are combined, as, for example, the method disclosed by Gray, U.S. Pat. No. 3,608,189, which leads to some improvement in compactness and reliability. No process is known, however, in which all the critical boundaries between sources and drains, guard bands, field oxides, and gate electrodes are determined by means of a single photomask.

Figures 1, 2:
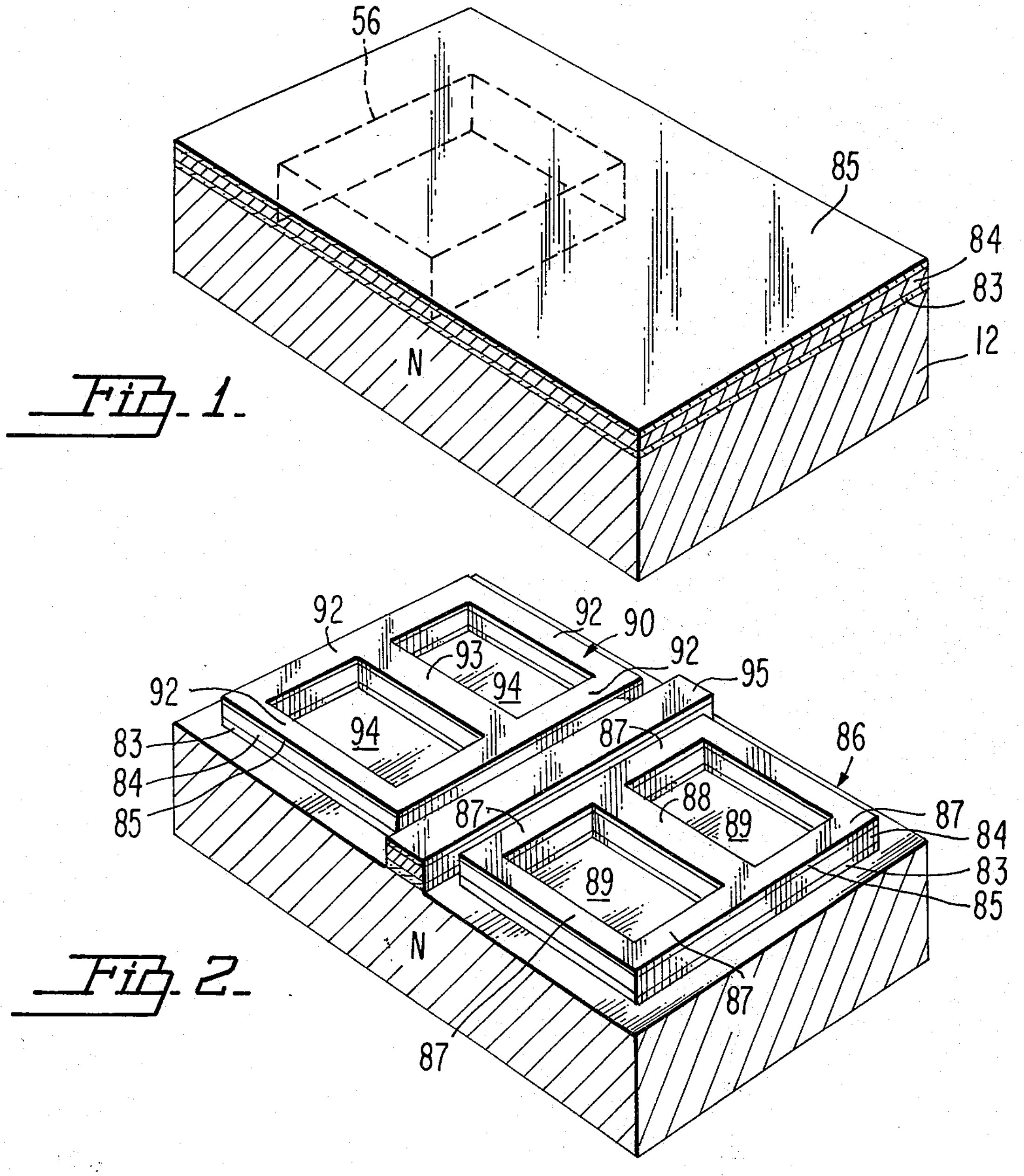
FIGS. 1 to 3 are perspective views of a fragmentary portion of a semiconductor wafer, illustrating some steps early in the present novel process.

The structure of a fragmentary portion of an example of a finished integrated circuit device 10, which includes both P type and N type MOS transistors, i.e., a CMOS device, made by the present novel process is illustrated in FIGS. 9 to 12. The device 10 is made from a body 12 of semiconductive material, usually a wafer of silicon, in which many similar devices 10 are formed in the manner well known in the art. The body 12 as shown in the drawings has a surface 14 adjacent to which the active elements of the device 10 are disposed.

The device 10 includes means defining a P type insulated gate field effect transistor 16 and means defining an N type insulated gate field effect transistor 18. While the present method may be used with particular advantage in the fabrication of devices including both P and N type transistors, it may also be employed with advantage for the manufacture of devices which include insulated gate field effect transistors of only one type conductivity.

The body 12 has several mesas 20 projecting from the surface 14 thereof, and the mesas 20 each have a flat surface 22 thereon which is generally parallel to the surface 14 of the body 12. The surfaces 22 of the mesas 20 are, in the preferred form of the present process to be described below, portions of the original planar surface of the body 12 and as such they are mutually coplanar.

The P type insulated gate field effect transistor 16 has spaced source and drain regions 24 and 26 (FIG. 10) which are bounded by PN junctions 28 are 30, respectively. The regions 24 and 26 are disposed within the body 12, with portions thereof in one of the mesas 20 adjacent to the sides thereof. There is a channel zone 32 in the body 12 between the regions 24 and 26 which is of conductivity type opposite to that of the source and drain regions 24 and 26. A channel-stopper guard band 33 surrounds the trasistor 16 in generally known manner.

A gate electrode 34 of refractory, conductive material such as polycrystalline silicon is disposed adjacent to the channel zone 32 and is separated therefrom by a gate insulator layer 36. The insultaing layer 36 may be a single layer, as shown, or it may be made up of plural layers of two or more different materials, such as silicon dioxide or silicon nitride, in the manner known in the art.

The gate electrode 34 has a planar surface 37 which is substantially parallel to the surface 22 of the mesa 20 and is spaced from the surface 14 of the body 12 by a predetermined distance determined by the combined thickness of the insulating layer 36 and the gate electrode 34 and the height of the mesa 20.

A relatively thick body 38 of insulating material, preferably genetic silicon dioxide, is disposed on the surface 14 of the body 12 in contiguous surrounding relation to the insulating layer 36 and the gate electrode 34. This body 38 has a surface 40 thereon which is generally parallel to the surface 14 of the body 12. The surface 40 of the body 38 is spaced the same distance or slightly further from the surface 14 of the body 12 than the surface 37 of the gate insulator 34 is spaced from the surface 14. The distance separating the two surfaces 37 and 40 should be in the range of 0 to about 1000 A.

A layer 42 of oxygen-impermeable insulating material having a thickness of about 1000 A. overlies the gate electrode 34. To enable contact to be made to the gate electrode 34, there is an aperture 44 (FIG. 12) in the insulating layer 42. Apertures 46 and 48 in the body 38 adjacent to the regions 26 and 24, respectively, enable contact to be made to these latter regions. A portion of a deposited conductor 50 contacts the region 26 through the aperture 46; a portion of the deposited conductor 52 extends through the opening 48 to contact the region 24; and, a conductor 54 has a portion extending through the aperture 44 to contact the gate electrode 34.

The N type insulated gate field effect transistor 18 is similarly constructed except that its parts are disposed in a P well 56 in the body 12 adjacent to the surface 14 thereof. The N type insulated gate field effect transistor 18 has spaced source and drain regions 58 and 60 (FIG. 11) which are bounded by PN junctions 62 and 64, respectively. The regions 58 and 60 are disposed within the P well 56 in the body 12 with portions thereof in another one of the mesas 20 adjacent to the sides thereof. There is a channel zone 66 between the regions 58 and 60 which is of the conductivity type of the P well, i.e., opposite to that to the regions 58 and 60. P+ type channel stopper guard band 67 surrounds the transistor 18.

The transistor 18 also has a gate electrode 68 disposed over the channel region 66 and separated from the surface 22 by a gate insulator 70 like the gate insulator 36 of the P type insulated gate field effect transistor 16. The body 38 of insulating material also surrounds the gate electrode 68 and the insulating layer 70, and there is a layer 72 of material like that of the layer 42 disposed over the gate electrode 68. An opening 74 (FIG. 12) in the material 72 enables contact to be made to the gate electrode 68 by a portion of the deposited conductor 54. An opening 76 in the insulating body 38 enables contact to be made to the region 60 by a portion of the deposited conductor 50. A deposited conductor 78 has a portion thereof extending through an opening 80 in the insulating body 38 to contact the other region 58 of the transistor 18. Because of the insulating nature of the layers 42 and 72 over the gate electrodes 34 and 68, and because the surface 40 of the body 38 is above the surface of the gate electrodes 34 and 68, conductors may cross over the gate electrodes without shorting thereto. Such a conductor is shown, for example, at 82 in FIGS. 9 and 12.

The two transistor 16 and 18 are interconnected as an inverter in the device structure shown. The drains are connected together by the conductor 50, and the gates of the two transistors are connected together by the conductor 54. Separate voltages may be applied to the sources of the two transistors via the conductors 52 and 78, usually a relatively high voltage on the conductor 52 and a relatively low voltage on the conductor 78. This combination of transistors will operate in well known manner to provide on the conductor 50 an output signal which is high when the input voltage on the gate conductor 54 is low and vice versa. Other circuit combinations of transistors can also be made.

The present novel method of making the device 10 is illustratedd in FIGS. 1 to 9. The distinctive steps of the method are illustrated, and nondistinctive conventional steps of cleaning, washing, and photomasking are omitted for clarity. The process begins, with reference the FIG. 1, with the step of forming a gate insulator layer 83 on the original surface of the body 12, which is, in this example, an N type wafer having diffused P wells, such as the P well 56, defined therein by means of a first photomask. The formation of the gate insulator layer 83 may be done in conventional manner, for example by heating the body 12 in an oxidizing ambient to a temperature of about 1000° C for a time long enough to grow the layer 36 to a thickness of about 1000° A. Next, a gate electrode layer 84 is formed on the surface of the gate insulator layer 83. The gate electrode layer 84 may also be formed conventionally, for example by heating the body 14 to a temperature between about 600° C and about 900° C in an atmosphere containing a source of silicon atoms, such as silane ($SiH_4$), to form the layer 84 as a polycrystalline silicon layer by the pyrolytic decomposition of the silane. The time and temperature of this step should be selected such that the gate electrode layer 84 has a thickness between about 3000 A. and about 6000 A. The gate electrode layer 84 may be doped either during its formation by including in the growth atmosphere a source of conductivity modifiers, such as diborane or phosphine, or it may be doped by diffusion, for example, after its formation.

The gate electrode layer 34 is next coated with a layer 85 of an oxygen-impermeable insulating material. Preferably, this material is silicon nitride ($Si_3N_4$), which may be formed, for example, by the pyrolytic decomposition of silane and ammonia on the surface of the gate electrode layer 84 at a temperature of about 1000° C. This procedure is also well known in the art.

FIG. 2 illustrates the next few steps in the process. A conventional photolithographic process using a second photomask is employed to define a pattern in the three layers—83, 84, and 85. Portions of the three layers are removed in this procedure, so as to leave on the original surface of the body 12 a patterned diffusion-masking layer which includes a first framelike structure 86 which, in this embodiment, has the shape of a rectangle having four sides, 87, of predetermined width. There is also a crossbar 88 of predetermined width extending between the midpoints of two of the sides 87 so as to define two diffusion openings, 89, in the framelike structure 86. A second framelike structure 90, having sides 92 and a crossbar 93, is disposed over the P well 56 and is arranged to define two diffusion openings 94, therein. The pattern further comprises an elongated bar 95 disposed between each of the framelike structures 86 and 90. The rectangular shape of the framelike structures 86 and 90 is preferred and other and different shapes may be employed if desired.

Figure 4:
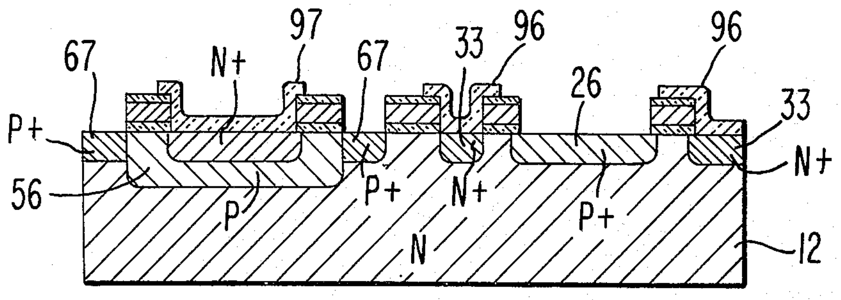
FIG. 4 is a cross section taken on the line 4—4 of FIG. 3.
Figure 3:
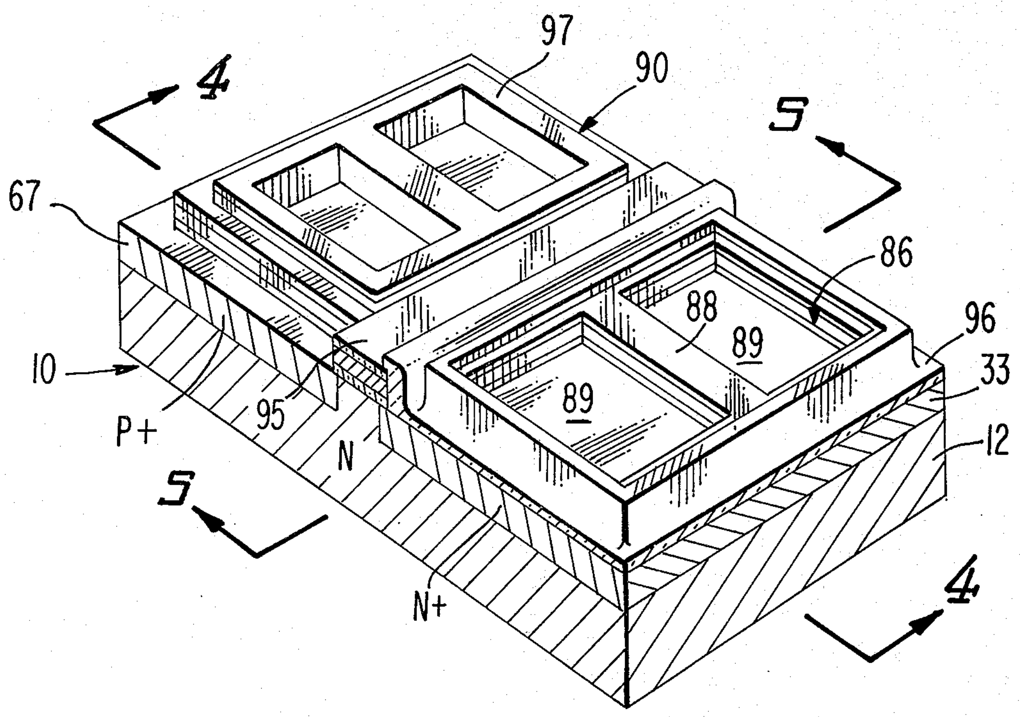
Figure 5:
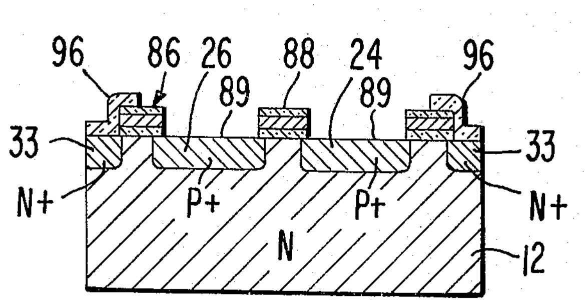
FIG. 5 is a cross section taken on the line 5—5 of FIG. 3.

The next steps in the present process are illustrated in FIGS. 3, 4, and 5. First a continuous layer of doped silicon dioxide is deposited over the exposed upper surfaces of the device 10. This may be accomplished, for example, by heating the device 10 to a temperature of about 400° C in an atmosphere comprising a mixture of silane, oxygen, and a source of donor impurities, such as phosphine, to form the doped oxide coating by the pyrolytic decomposition and oxidation of the silicon and phosphorus in the gas mixture. This doped oxide coating is then defined photolithographically with the help of a third photomask to form doped oxide diffusion sources 96 and 97 (FIG. 3). As shown, the diffusion source 96 covers the surface portions of the body 12 outside the framelike structure 86 and overlaps the framelike structure 86 and the elongated bar 95. The diffusion source 97, however, is disposed on the framelike structure 90 with portions thereof contacting the surface of the body 12 within the diffusion openings 94 in the framelike structure 90. The photomask used to define these diffusion sources 96 and 97 need not be critically aligned, since the position of the diffusion sources 96 and 97 can vary substantially with respect to the framelike structures 86 and 90 without changing the results of the process.

The device 10 with the doped oxide diffusion sources 96 and 97 thereon is next disposed in a diffusion furnace, and a coventional P+ predeposition step in performed which results in the diffusion of acceptor impurities, boron, for example, into the uncovered portions of the body 12; that is, the surface portions within the masking openings 89 in the framelike structure 86 and the surface portion outside the framelike structure 90. Simultaneously, phosphorus impurities will diffuse from the dopped oxide sources 96 and 97 to form diffused regions in the body 12 therebeneath. This procedure simultaneously forms the source and drain regions 24 and 26 of the P type transistor 16, the source and drain regions 58 and 60 of the N type transistor 18, the N+ type guard band 33, and the P+ type guard band 67. All these regions are thus defined with a single photomask.

Figures 6, 7:
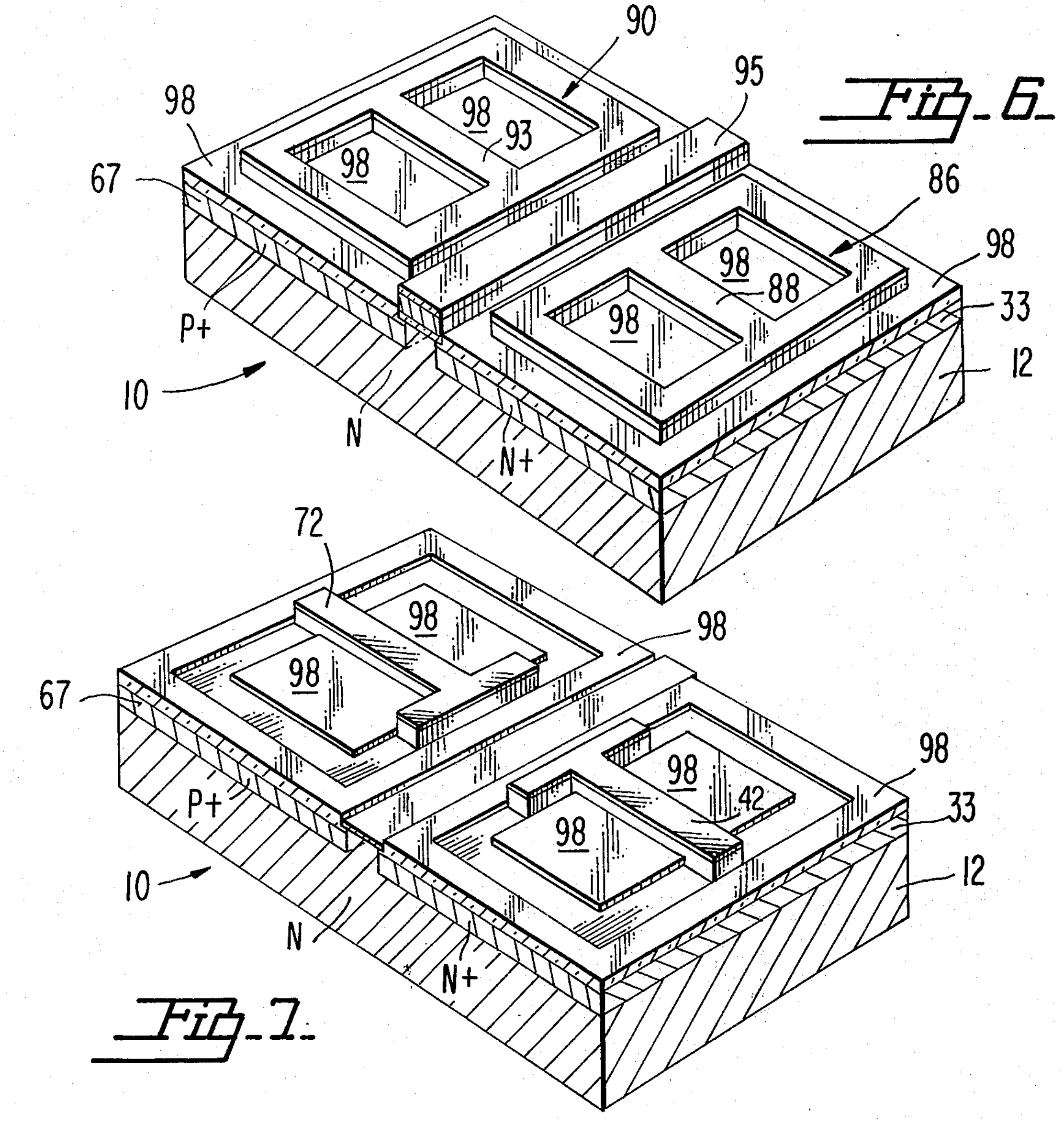
FIGS. 6 and 9 are perspective views illustrating other steps in the present novel process.
Figure 10:
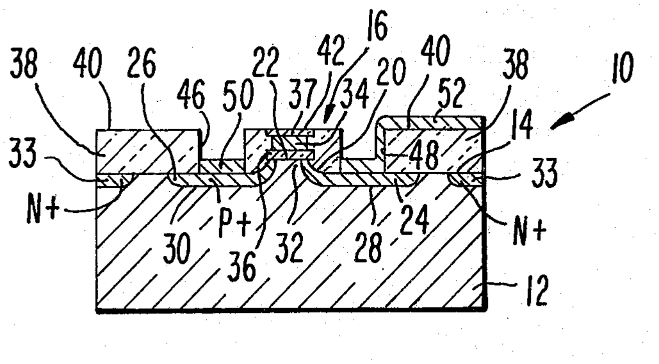
FIG. 10 is a cross section taken on the line 10—10 of FIG. 9.
Figures 8, 9, 11:
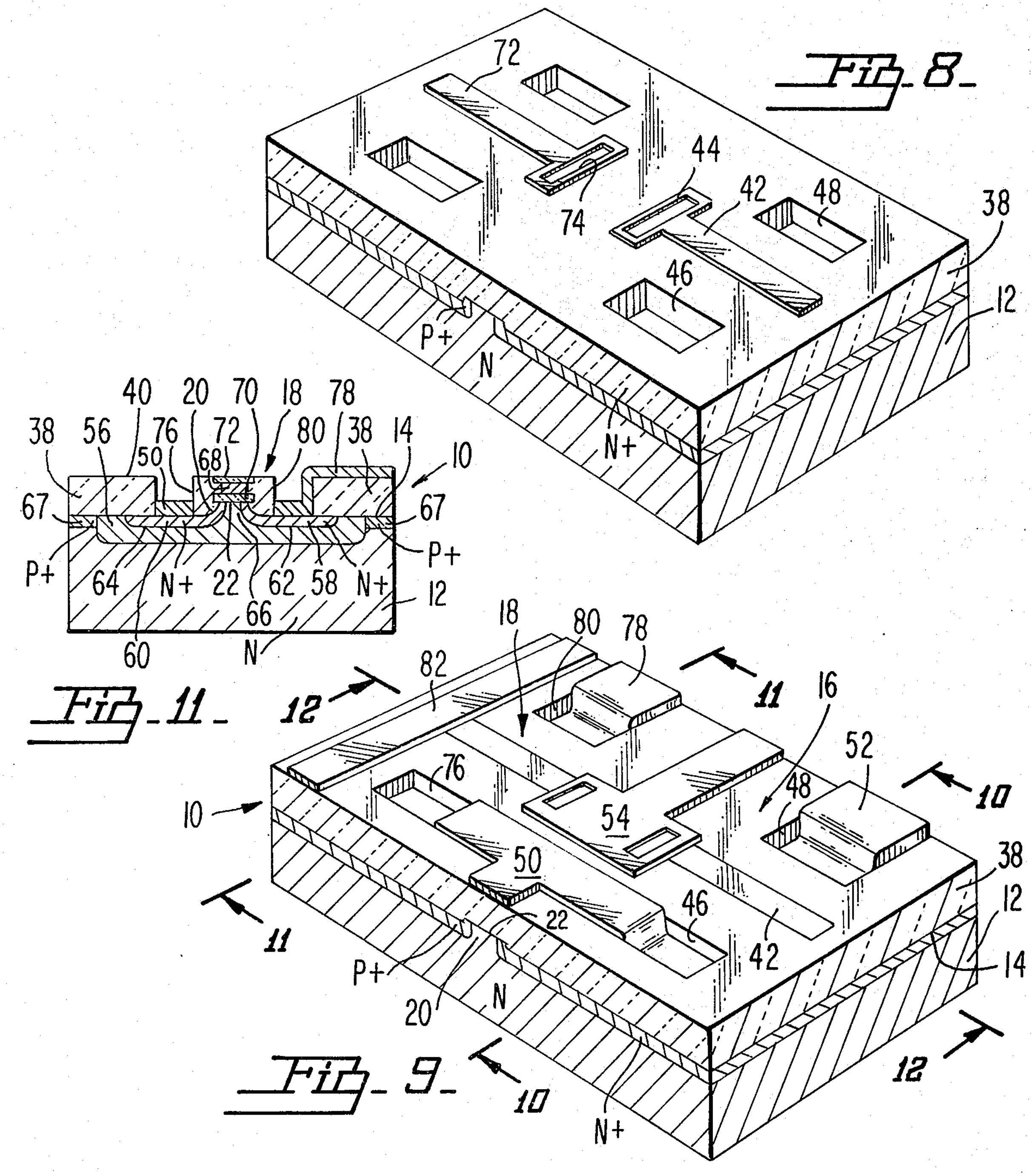
FIG. 11 is a cross section taken on the line 11—11 of FIG. 9.
Figure 12:
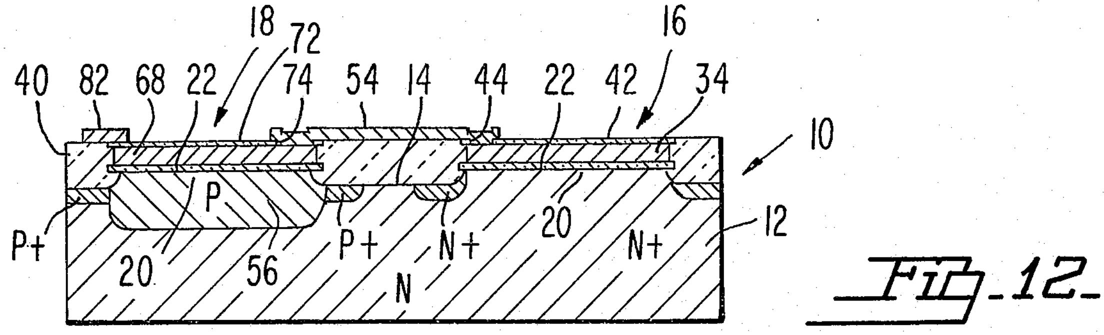
FIG. 12 is a cross section taken on the line 12—12 of FIG. 9.

The doped oxide diffusion sources 96 and 97 are next removed together with any residual oxides produced during the P+ predeposition step. The exposed surfaces of the body 12 are then oxidized by heating the body 12 to a temperature of about 900° C in steam, for example, to produce a relatively thin oxide coating 98 on all the exposed surfaces of the body 12. The configuration of the device 10 at the conclusion of this step is illustrated in FIG. 6. This oxide coating 98 is for the purpose of protecting the silicon body 12 from a solvent for silicon which is used in the next series of steps, illustrated in FIG. 7.

A fourth photomask is next employed for defining the gate electrodes 34 and 68 together with enlarged contact areas for these electrodes. This fourth mask should be arranged to protect at least the crossbars 88 and 93 of the framelike structure 86 and 90, respectively, and preferably a portion of each of the sides of the framelike structures 86 and 90 which is adjacent to the ends of the crossbars 88 and 93. Preferably, a relatively large portion of the sides of the framelike structures is left at the end of the crossbars where contact will be made. The silicon and silicon nitride layers in the unprotected portions of the framelike structures 86 and 90 and in the elongated bar 95 are removed by contacting them sequentially with a solvent for silicon nitride, such as phosphoric acid (at 180° C), to remove the top layer, and a solvent for silicon, such as potassium hydroxide, to remove the polycrystalline silicon layer. The configuration of the device 10 at the conculsion of this step is shown in FIG. 7.

The device 10 in the form shown in FIG. 7 is next placed in an oxidation furnace and heated to a temperature of 900° C in steam for a time sufficient to grow the body 38 of silicon dioxide to the desired thickness. This oxidation process consumes part of the body 12 by chemically combining with the silicon thereof, and the body 38 has a thickness approximately twice the depth of the siilicon consumed. The body 38 should be grown to a thickness such that is upper surface is located substantially coplanar with the top surface of the silicon nitride layers 42 and 72. The time of this oxidation step will vary with the temperature chosen and with the required thickness of the body 38 and may be determined routinely. During this step, the gate electrodes 34 and 68 will oxidize slightly from the sides therreof, but a major portion of each of the gate electrodes 34 and 68 will not oxidize because of the protection afforded by the oxygen impermeable character of the coatings 4 and 72.

Next, contact openings are formed in the silicon nitride layers 42 and 72 by masking the surface and contacting the desired areas with a solvent for silicon nitride. Thereafter, another etch-resistant mask is applied to the surface of the device, and the source and drain contact openings 46, 48, 76, and 80 are etched through the body 38 to expose portions of the diffused regions 24, 26, 60, and 58, respectively.

The next step is to metallize the device 10 by, for example, depositing aluminum thereon in conventional manner. The deposited aluminum is then defined photolithographically to form the conductors 50, 52, 54, 78, and 82.

The device 10, when fabricated in this manner, has a very flat upper surface so that crossover are facilitated and yield losses due to opens in the metallization at crossover locations are reduced. Three critical alignments which have been required to make CMOS devices heretofore are eliminated in this process because the source and drain regions, the guard bands, and the silicon gates are all defined by one photomask. The normal misalignment tolerances, needed when independent masks are used, are eliminated. Other advantages arise from the use of the framelike diffusion masking structures in this process. For example, in conventional guard-banded devices, it is common practice to provide an overlap of the gate electrode over the adjacent guard band so that leakage around the end of the gate electrode is prevented. In the present device, the ends of the gate electrodes are self-aligned with the inner edges of the guard bands so that less space is required, while leakage prevention is still maintained. The silicon gates are also self-aligned with he sources and drains in this structure, as in the known self-aligned silicon gate structure.

What is claimed is:

1. A method of making an integrated circuit device including an insulted gate field effect transistor, from a body of semiconductive material having a surface, comprising the steps of forming on said surface a diffusion-masking, framelike structure which has sides of predetermined width and a crossbar of predetermined width whereby two openings are defined therein, said framelike structure comprising a gate insulator layer on said surface of said body, a refractory conductor layer on said gate insulator layer, and an oxygen-impermeable layer on said conductor layer, diffusing conductivity modifiers into said body through the surface portions thereof within the two openings in said framelike structure to form spaced diffused regions in said body, diffusing conductivity modifiers into said body through surface portions outside and immeditely adjacent said framelike structure, and removing portions of at least the conductor layer and the oxygen-impermeable layer in said framelike structure to leave on said surface at least those portions of said layers located in the crossbar of said framelike structure.

2. A method of making an integrated circuit device as defined in claim 1 comprising the further steps of forming an insulating layer on those portions of said surface of said body not covered by said crossbar, removing a portion of said insulating layer adjacent to each of said spaced regions, removing a portion of said oxygen-impermeable layer adjacent to said conductor layer in said crossbar, and applying contacts to said spaced regions and to said conductor layer.

3. A method of making an integrated circuit device as defined in claim 2 wherein said conductor layer is formed by depositing a layer of polycrystalline silicon on said gate insulator layer.

4. A method of making an integrated circuit device as defined in claim 2 wherein said diffusing steps are performed simultaneously.

5. A method of making an integrated circuit device as defined in claim 2 wherein said semiconductive material is silicon and wherein said insulating layer-forming step is carried out by heating said body in an oxidizing atmosphere at a predetermined temperature for a predetermined time to grow a silicon dioxide layer in contiguous surrounding relation to said crossbar.

6. A method of making an integrated circuit device as defined in claim 5 wherein said heating step is carried out for a time such that a source of said silicon dioxide layer is substantially coplanar with the surface of said crossbar.

7. A method of making an integrated circuit device as defined in claim 2 wherein, in said step of removing portions of the layers in said framelike structures, portions are left of each of said two sides of said framelike structure adjacent to the ends of said crossbar.

8. A method of making an integrated circuit device containing insulated gate field effect transistors of complementary type in a body of semiconductive material, largely of one type conductivity, which has a surface and a region of conductivity type opposite to the remainder of said body in said body adjacent to said surface, comprising the steps of forming on said surface of said body successive layers of a gate insulator layer on said surface of said body, a refractory conductor layer on said gate insulator layer, and an oxygen-impermeable and conductivity modifier-impermeable layer on said conductor layer, removing portions of said layers to leave on said surface a patterned diffusion-masking layer comprising a first framelike structure, having sides of predetermined width and a crossbar of predetermined width defining two openings in said framelike structure, disposed over a portion of said surface of said body outside said region of opposite type conductivity, a second framelike structure, having sides of predetermined width and having a crossbar of predetermined width defining two openings therein, disposed over said region of opposite type conductivity, depositing a solid source of conductivity modifiers onto the surface portions of said body within the two openings in one of said framelike structures, depositing a solid source of conductivity modifiers onto the surface portions of said body outside the other framelike structure and heating said body to cause diffusion of conductivity modifiers from said solid sources of conductivity modifiers while simultaneously exposing the uncovered portions of said surface to a source of conductivity modifiers of the type opposite to that of those in said solid sources.

9. A method of making an integrated circuit device as defined in claim 8 wherein in said removing step a portion of said layers is left in the form of an elongated bar disposed between each of said framelike structures.

10. A method of making an integrated circuit device as defined in claim 9 comprising the further step of removing portions of at least the conductor layer and the oxygen-impermeable layer in each of said framelike structures to leave at least those portions of said layers located in the crossbars of said framelike structures.

11. A method of making an integrated circuit device as defined in claim 10 wherein each of said crossbar has a predetermined width which thereby predetermines the spacing between the spaced diffused regions adjacent to each crossbar.

12. A method of making an integrated circuit device as defined in claim 11 wherein the sides of each of said framelike structures each have a predetermined width which thereby predetermines the spacing between the spaced diffused regions and said surrounding regions.

* * * * *